United States Patent
Lai

(10) Patent No.: US 12,402,298 B2
(45) Date of Patent: Aug. 26, 2025

(54) SEMICONDUCTOR STRUCTURE INCLUDING BIT LINE STRUCTURE COVERED BY OXIDE BARRIER LAYER AND MANUFACTURING METHOD THEREOF

(71) Applicant: NANYA TECHNOLOGY CORPORATION, New Taipei (TW)

(72) Inventor: Jen-I Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 208 days.

(21) Appl. No.: 18/056,724

(22) Filed: Nov. 18, 2022

(65) Prior Publication Data

US 2024/0172414 A1    May 23, 2024

(51) Int. Cl.
    *H10B 12/00*    (2023.01)
(52) U.S. Cl.
    CPC ........... *H10B 12/30* (2023.02); *H10B 12/482* (2023.02)
(58) Field of Classification Search
    CPC .............................. H10B 12/482; H10B 12/30
    USPC ....................................................... 257/295
    See application file for complete search history.

(56) References Cited

U.S. PATENT DOCUMENTS

| | | | | |
|---|---|---|---|---|
| 6,090,701 A | * | 7/2000 | Hasunuma | H01L 21/76882 438/650 |
| 6,550,915 B1 | * | 4/2003 | Grobe, III | C08J 7/123 525/326.4 |
| 6,746,925 B1 | * | 6/2004 | Lin | H01L 21/32105 438/452 |
| 11,991,876 B2 | * | 5/2024 | Pan | H10B 12/053 |
| 2007/0007578 A1 | * | 1/2007 | Li | H01L 29/40114 257/315 |
| 2010/0267247 A1 | * | 10/2010 | Ma | H01L 21/32105 438/770 |
| 2014/0061806 A1 | * | 3/2014 | Eun | H10B 12/485 257/368 |
| 2020/0006533 A1 | * | 1/2020 | Tsai | H01L 29/785 |
| 2022/0052049 A1 | * | 2/2022 | Chen | H10B 12/30 |
| 2022/0223603 A1 | * | 7/2022 | Ping | H10B 12/482 |
| 2023/0067536 A1 | * | 3/2023 | Lu | H10B 12/34 |
| 2024/0008263 A1 | * | 1/2024 | Lu | H10B 12/482 |

FOREIGN PATENT DOCUMENTS

| | | | |
|---|---|---|---|
| CN | 102446831 | * | 5/2012 |
| CN | 102544354 | * | 7/2012 |
| CN | 112018080 | * | 12/2020 |
| CN | 113035873 A | | 6/2021 |
| KR | 20050028961 | * | 3/2005 |
| KR | 20090037553 | * | 4/2009 |
| TW | 202137415 A | | 10/2021 |
| WO | WO-9917351 A1 | * | 4/1999 ............. H01L 21/18 |

* cited by examiner

*Primary Examiner* — Sheng-Bai Zhu
(74) *Attorney, Agent, or Firm* — CKC & Partners Co., LLC

(57) ABSTRACT

A semiconductor structure includes a substrate, a bit line structure, an oxide barrier layer, and a bit line capping layer. The bit line structure is disposed on the substrate, in which the bit line structure includes a conductive silicon layer, a conductive layer, and a hard mask layer. The conductive layer is disposed on the conductive silicon layer, in which the conductive layer includes a metal. The hard mask layer is disposed on the conductive layer. The oxide barrier layer is disposed in direct contact with a sidewall of the bit line structure. The bit line capping layer covers the oxide barrier layer.

19 Claims, 5 Drawing Sheets

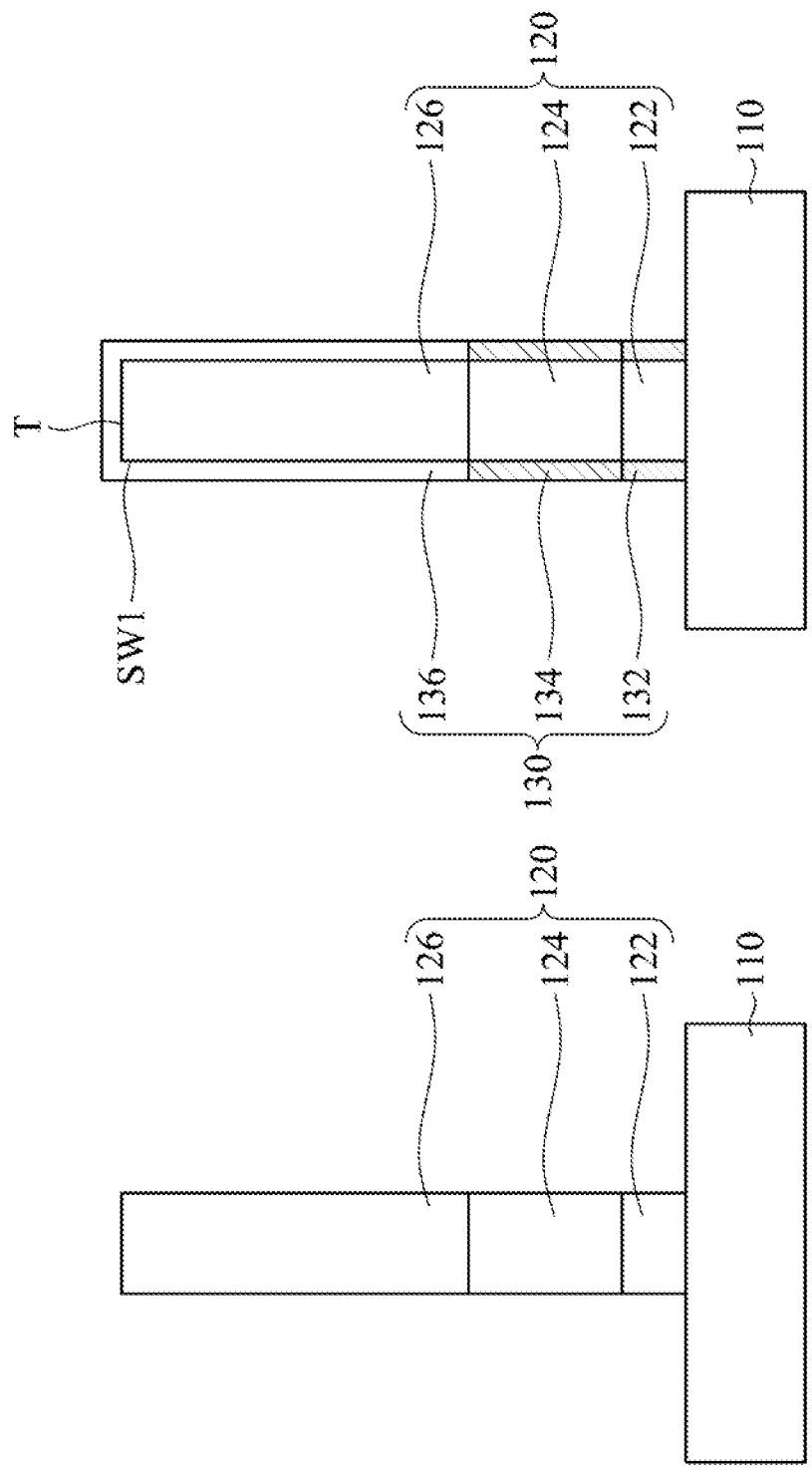

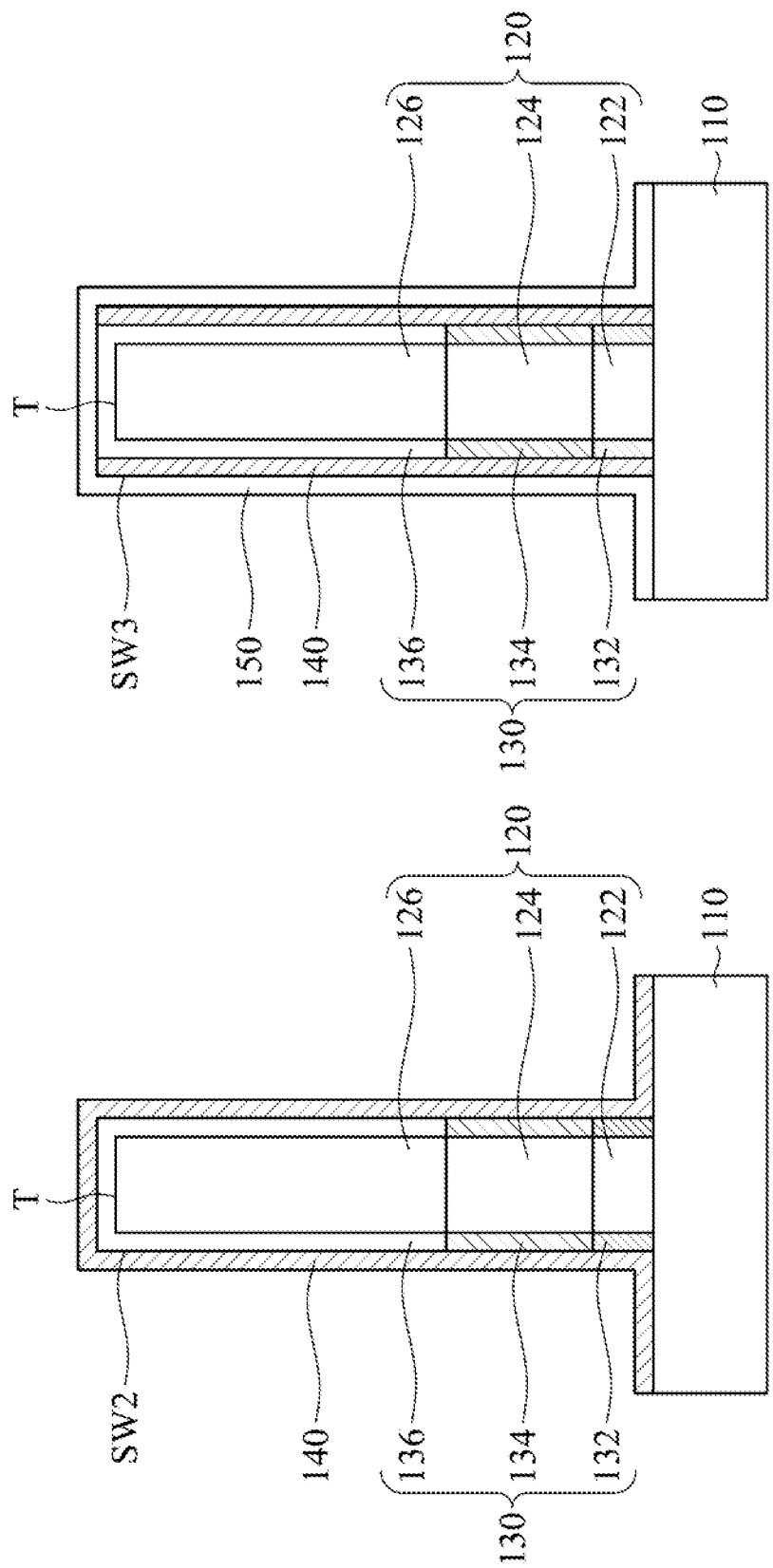

SEMICONDUCTOR STRUCTURE INCLUDING BIT LINE STRUCTURE COVERED BY OXIDE BARRIER LAYER AND MANUFACTURING METHOD THEREOF

BACKGROUND

Field of Invention

The present disclosure relates to a semiconductor structure and a manufacturing method thereof.

Description of Related Art

A dynamic random access memory (DRAM) is a semiconductor arrangement for storing bits of data with cell capacitors within an integrated circuit. DRAMs commonly include trench capacitor DRAM cells and/or stacked capacitor DRAM cells.

As DRAM devices become more highly integrated, design rules of the DRAM devices become finer. However, as the size of a DRAM device is reduced, the DRAM device may have a problem associated with leakage current. Therefore, there is need to use a capping layer to protect components in the DRAM device to be electrically insulated from other components. However, during the manufacturing process of the capping layer, the electrical performance of the components may be influenced. To overcome the performance issue, there is a significant need to improve the manufacturing process.

SUMMARY

The present disclosure provides a semiconductor structure including a substrate, a bit line structure, an oxide barrier layer, and a bit line capping layer. The bit line structure is disposed on the substrate, in which the bit line structure includes a conductive silicon layer, a conductive layer, and a hard mask layer. The conductive layer is disposed on the conductive silicon layer, in which the conductive layer includes a first metal. The hard mask layer is disposed on the conductive layer. The oxide barrier layer is disposed in direct contact with a first sidewall of the bit line structure. The bit line capping layer covers the oxide barrier layer.

In some embodiments, the oxide barrier layer includes a first portion in direct contact with the conductive silicon layer and a second portion in direct contact with the conductive layer, the first portion includes SiO, $SiO_2$, or a combination thereof, and the second portion includes a first oxide of the first metal.

In some embodiments, the oxide barrier layer further includes a third portion in direct contact with the hard mask layer, the hard mask layer includes an insulating material selected from the group consisting of $Si_3N_4$, SiCN, SiC, and $SiO_2$, and the third portion includes a second oxide of the insulating material of the hard mask layer.

In some embodiments, the semiconductor structure further includes a first barrier layer disposed between the conductive silicon layer and the conductive layer, in which the first barrier layer includes a second metal, the oxide barrier layer further includes a third portion in direct contact with the first barrier layer, and the third portion includes a second oxide of the second metal.

In some embodiments, the first barrier layer includes a metal layer, a metal nitride layer, a metal silicide layer, or combinations thereof.

In some embodiments, the metal layer includes a metal selected from the group consisting of Co, Cu, Ni, Ru, Mn, Ag, Au, Pt, Fe, Mo, Rh, Ti, Ta, and W, the metal nitride layer includes a material selected from the group consisting of tungsten nitride, TiN, and TaN, and the metal silicide layer includes a material selected from the group consisting of tungsten silicide, tantalum silicide, titanium silicide, molybdenum silicide, zirconium silicide, cobalt silicide, chromium silicide, and nickel silicide.

In some embodiments, the semiconductor structure further includes a second barrier layer disposed between the conductive silicon layer and the first barrier layer, in which the second barrier layer includes a third metal, the oxide barrier layer further includes a fourth portion in direct contact with the second barrier layer, and the fourth portion includes a third oxide of the third metal.

In some embodiments, the first barrier layer is a first metal nitride layer or a metal silicide layer, the second barrier layer is a second metal nitride layer or a metal layer, and the first metal nitride layer and the second metal nitride layer have different materials.

In some embodiments, the semiconductor structure further includes a third barrier layer disposed between the first barrier layer and the conductive layer, in which the third barrier layer includes a fourth metal, the oxide barrier layer further includes a fifth portion in direct contact with the third barrier layer, and the fifth portion includes a fourth oxide of the fourth metal.

In some embodiments, the first barrier layer is a metal silicide layer, the second barrier layer is a metal layer or a first metal nitride layer, the third barrier layer is a second metal nitride layer, and the first metal nitride layer and the second metal nitride layer have different materials.

In some embodiments, the bit line capping layer includes a first nitride layer, an oxide layer, and a second nitride layer. The first nitride layer covers a second sidewall of the oxide barrier layer. The oxide layer covers a third sidewall of the first nitride layer. The second nitride layer covers a fourth sidewall of the oxide layer and a top surface of the bit line structure.

In some embodiments, the oxide barrier layer consists of $SiO_2$.

In some embodiments, the conductive layer includes a metal selected from the group consisting of W, Ru, Ir, Pt, Rh, and Mo.

The present disclosure provides a method of manufacturing a semiconductor structure including the following operations. A bit line structure disposed on a substrate is received, in which the bit line structure includes a conductive silicon layer, a conductive layer, and a hard mask layer. The conductive layer is disposed on the conductive silicon layer, in which the conductive layer includes a first metal. The hard mask layer is disposed on the conductive layer. An oxide barrier layer is formed in direct contact with a sidewall of the bit line structure. A bit line capping layer is formed to cover the oxide barrier layer.

In some embodiments, forming the oxide barrier layer in direct contact with the sidewall of the bit line structure includes: performing a plasma treatment on the bit line structure to form the oxide barrier layer by oxidizing a first surface portion of the conductive silicon layer, a second surface portion of the conductive layer, and a third surface portion of the hard mask layer.

In some embodiments, the plasma treatment is performed at a temperature between 225° C. and 275° C., and a plasma gas is generated from an oxidizing gas and a reducing gas.

In some embodiments, a flow rate percentage of the reducing gas is between 30% and 50% in the plasma gas.

In some embodiments, a treatment time of the plasma treatment is between 20 seconds and 45 seconds.

In some embodiments, the bit line structure further includes: a first barrier layer disposed between the conductive silicon layer and the conductive layer, in which the first barrier layer includes a second metal.

In some embodiments, forming the oxide barrier layer in direct contact with the sidewall of the bit line structure includes: performing a plasma treatment on the bit line structure to form the oxide barrier layer by oxidizing a first surface portion of the conductive silicon layer, a second surface portion of the conductive layer, a third surface portion of the hard mask layer, and a fourth surface portion of the first barrier layer.

BRIEF DESCRIPTION OF THE DRAWINGS

The disclosure can be more fully understood by reading the following detailed description of the embodiment, with reference made to the accompanying drawings as follows:

FIGS. 1A-1F are cross-sectional views schematically illustrating intermediate stages in the manufacturing of a semiconductor structure, in accordance with some embodiments of the present disclosure.

DETAILED DESCRIPTION

Figure 1E:
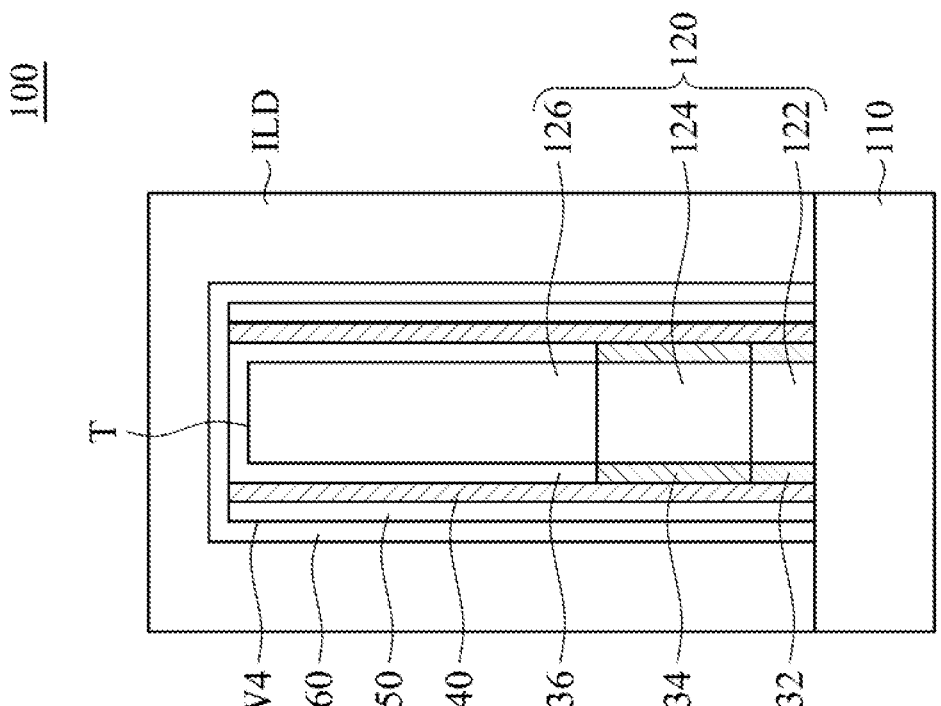

Reference will now be made in detail to the embodiments of the present disclosure, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

The present disclosure provides a method of manufacturing a semiconductor structure. The semiconductor structure includes a bit line structure, an oxide barrier layer, and a bit line capping layer. During the manufacturing process, the oxide barrier layer is formed on the bit line structure, and subsequently the bit line capping layer is formed on the oxide barrier layer. Since the bit line structure is protected by the oxide barrier layer, the forming step of the bit line capping layer may not adversely influence the bit line structure. For example, the element of the bit line capping layer may not diffuse into the bit line structure to influence the electrical performance of the bit line structure. In other words, the oxide barrier layer can block diffusion element migration from the bit line capping layer. Furthermore, the bit line structure of the present disclosure may be disposed in a DRAM device.

The present disclosure provides several embodiments for further illustration. FIGS. 1A-1F are cross-sectional views schematically illustrating intermediate stages in the manufacturing of a semiconductor structure, in accordance with some embodiments of the present disclosure.

Reference is made to FIG. 1A. A bit line structure 120 disposed on a substrate 110 is received, in which the bit line structure 120 includes a conductive silicon layer 122, a conductive layer 124, and a hard mask layer 126. The conductive silicon layer 122 is disposed on the substrate 110. The conductive layer 124 is disposed on the conductive silicon layer 122, in which the conductive layer 124 includes a first metal. The hard mask layer 126 is disposed on the conductive layer 124. As shown in FIG. 1A, the conductive silicon layer 122 directly contacts with the conductive layer 124. However, in other embodiments, one or more barrier layers (not shown) are disposed between the conductive silicon layer 122 and the conductive layer 124. The conductive layer 124 directly contacts with the hard mask layer 126.

Please still referring to FIG. 1A, in some embodiments, the substrate 110 includes an understructure (not shown) including landing plugs (not shown) to be electrically connected with a bit line structure. In some embodiments, the substrate 110 is one of a single crystal silicon wafer, a silicon on insulator (SOI) substrate, an epitaxial growth layer, or other semiconducting layers. In some embodiments, the conductive silicon layer 122 includes polysilicon. In some embodiments, the conductive layer 124 includes a metal selected from the group consisting of W, Ru, Ir, Pt, Rh, and Mo. In some embodiments, the hard mask layer 126 includes an insulating material selected from the group consisting of $Si_3N_4$, SiCN, SiC, and $SiO_2$.

Attention is now invited to FIG. 1B. An oxide barrier layer 130 is formed in direct contact with a first sidewall SW1 and a top surface T of the bit line structure 120. In some embodiments, the oxide barrier layer 130 is formed by performing a plasma treatment on the bit line structure 120 to form the oxide barrier layer 130 by oxidizing a first surface portion of the conductive silicon layer 122, a second surface portion of the conductive layer 124, and a third surface portion of the hard mask layer 126. Therefore, the oxide barrier layer 130 includes a first portion 132 in direct contact with the conductive silicon layer 122, a second portion 134 in direct contact with the conductive layer 124, and a third portion 136 in direct contact with the hard mask layer 126. Since the conductive silicon layer 122 includes silicon, the first portion 132 of the oxide barrier layer 130 includes SiO, $SiO_2$, or a combination thereof. Since the conductive layer 124 includes a first metal, the second portion 134 of the oxide barrier layer 130 includes a first oxide of the first metal. In some embodiments, the first oxide of the first metal includes an oxide of W, Ru, Ir, Pt, Rh, Mo, or alloy of these metals. In some embodiments, since the hard mask layer 126 includes an insulating material selected from the group consisting of $Si_3N_4$, SiCN, SiC, and $SiO_2$, the third portion 136 of the oxide barrier layer 130 includes a second oxide of the insulating material of the hard mask layer 126.

In some embodiments, the plasma treatment is performed at a temperature between 225° C. and 275° C., and a plasma gas is generated from an oxidizing gas and a reducing gas. The oxide barrier layer 130 can have a proper thickness under this temperature range. In some embodiments, the plasma treatment is performed in dry strip equipment. During the plasma treatment, surface portions of the bit line structure 120 are oxidized by plasma generated from the oxidizing gas to form the oxide barrier layer 130. Simultaneously, a portion of the oxide barrier layer 130 is reduced by plasma generated from the reducing gas. The reducing gas may prevent an excess of the bit line structure 120 from being oxidized, and therefore the resistance of the bit line structure 120 may not be greatly influenced and/or increased. Simultaneous use of the oxidizing gas and the reducing gas can form the oxide barrier layer 130 with a proper thickness. Therefore, the oxide barrier layer 130 can have good ability to block element diffusion into the bit line structure 120 during forming a bit line capping layer on the oxide barrier layer 130 (described in FIGS. 1C-1E) without affecting the electrical performance of the bit line structure 120. In some embodiments, the oxide barrier layer 130 has a thickness between 3 angstrom and 5 angstrom. In some embodiments, the oxide barrier layer 130 has a substantially uniform thickness. In some embodiments, a treatment time of the plasma treatment is between 20 seconds and 45 seconds. In some embodiments, a plasma power of the plasma treatment is between 3500 W and 4500 W, such as 3500, 3700, 3900, 4100, 4300, or 4500 W.

For example, the oxidizing gas includes $O_2$, and the reducing gas includes $NH_3$. In some embodiments, a flow rate percentage of the reducing gas is between 30% and 50% in the plasma gas. For example, a flow rate percentage of $NH_3$ is between 30% and 50% in the plasma gas containing $O_2$ and $NH_3$. If the flow rate percentage is greater than 50%, the oxide barrier layer 130 may not have enough thickness to block element diffusion. If flow rate percentage is less than 30%, an excess of the bit line structure 120 may be oxidized, and its electrical performance may be influenced.

Please still refer to FIG. 1B. In some embodiments, the conductive silicon layer 122 includes polysilicon, the conductive layer 124 includes W, and the hard mask layer 126 includes $Si_3N_4$. The oxide barrier layer 130 is formed by oxidizing surface portions of the conductive silicon layer 122, the conductive layer 124, and the hard mask layer 126. The oxide barrier layer 130 includes the first portion 132 containing SiO, $SiO_2$, or a combination thereof, the second portion 134 containing $WO_3$, and the third portion 136 containing SiON.

In some embodiments, before forming the oxide barrier layer 130, the bit line structure 120 is etch cleaned by, for example, dilute hydrofluoric acid (DHF) and $NH_4OH$, to remove the remains on the surface of the bit line structure 120, which is byproducts of patterning the bit line structure 120 by, for example, dry etch.

Reference is made to FIGS. 1C-1E. A bit line capping layer BC is formed to cover the bit line structure 120 and the oxide barrier layer 130. In some embodiments, the bit line capping layer BC is a single layer or multilayers. The single layer may be an insulating nitride layer. In some embodiments, the bit line capping layer BC is called a bit line spacer and is an insulating layer.

As shown in FIG. 1C, a first nitride layer 140 is formed to cover a second sidewall SW2 and the top surface of the oxide barrier layer 130 and the substrate 110. In some embodiments, the first nitride layer 140 is in direct contact with the first portion 132, the second portion 134, and the third portion 136 of the oxide barrier layer 130. In some embodiments, the first nitride layer 140 is an insulating layer. In some embodiments, the first nitride layer 140 includes an insulating material selected from the group consisting of $Si_3N_4$ and SiCN. In some embodiments, the first nitride layer 140 is formed by an atomic layer deposition (ALD) or a chemical vapor deposition (CVD). Since the bit line structure 120 is protected by the oxide barrier layer 130, the forming step of the first nitride layer 140 may not adversely influence the bit line structure 120. For example, the element of the first nitride layer 140, such nitrogen (N), may not diffuse or penetrate into the bit line structure 120 to influence the electrical performance of the bit line structure 120. The oxide barrier layer 130 can block diffusion nitrogen migration. For example, the conductive layer 124 may include tungsten (W). If the conductive layer 124 is not protected by the oxide barrier layer 130, tungsten may react with the nitrogen of the first nitride layer 140 to form tungsten nitride, which is high k material. In other words, sidewall portions of the conductive layer 124 include tungsten nitride that abnormally grows. Therefore, the overall electrical performance of the bit line structure 120 may be adversely influenced, the resistance of the conductive layer 124 increases, and therefore its electrical performance cannot satisfy the design requirement.

Attention is now invited to FIGS. 1C-1D. Portions of the first nitride layer 140 that are in direct contact with the substrate 110 and the top surface of the oxide barrier layer 130 are removed, and therefore the remaining first nitride layer 140 are disposed adjacent two sides of the bit line structure 120 and two sides of the oxide barrier layer 130 as shown in FIG. 1D. Moreover, an oxide layer 150 is formed to cover a third sidewall SW3 of the first nitride layer 140, the substrate 110, and the oxide barrier layer 130. In some embodiments, the oxide layer 150 is in direct contact with the top surface of the third portion 136 of the oxide barrier layer 130. In some embodiments, the oxide layer 150 is an insulating layer. In some embodiments, the oxide layer 150 includes $SiO_2$.

Please refer to FIGS. 1D-1E. Portions of the oxide layer 150 that are in direct contact with the substrate 110, the top surface of the oxide barrier layer 130, and the top surface of the first nitride layer 140 are removed, and therefore the remaining oxide layer 150 are disposed adjacent two sides of the bit line structure 120, two sides of the oxide barrier layer 130, and two sides of the first nitride layer 140 as shown in FIG. 1E. Moreover, a second nitride layer 160 is formed to cover a fourth sidewall SW4 of the oxide layer 150, the top surface T of the bit line structure 120, the oxide barrier layer 130, and the first nitride layer 140. Therefore, the bit line capping layer BC including the first nitride layer 140, the oxide layer 150, and the second nitride layer 160 is formed. In some embodiments, the second nitride layer 160 includes an insulating material selected from the group consisting of $Si_3N_4$ and SiCN. In some embodiments, the second nitride layer 160 is formed by an atomic layer deposition (ALD) or a chemical vapor deposition (CVD).

Figure 1F:
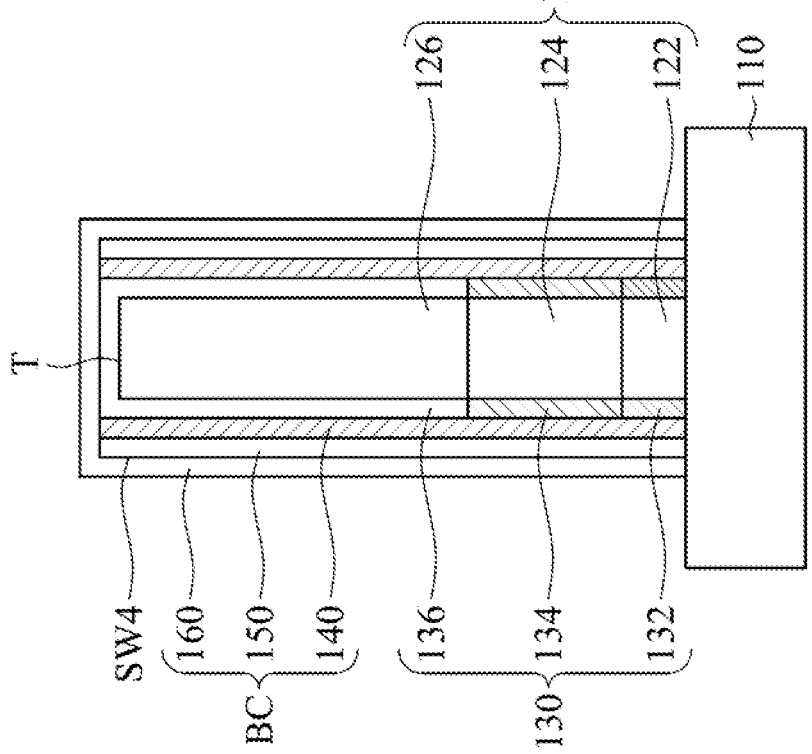

Reference is made to FIG. 1F. An interlayer dielectric layer ILD is formed to cover the bit line capping layer BC. As shown in FIG. 1F, the bit line structure 120 is disposed on the substrate 110 and includes the conductive silicon layer 122, the conductive layer 124, and the hard mask layer 126. The conductive layer 124 includes a first metal. The oxide barrier layer 130 covers the bit line structure 120 and includes the first portion 132 containing SiO, $SiO_2$, or a combination thereof, the second portion 134 containing the first oxide of the first metal, and the third portion 136 containing the second oxide of the insulating material of the hard mask layer 126. The bit line capping layer BC including the first nitride layer 140, the oxide layer 150, and the second nitride layer 160 covers the oxide barrier layer 130. It is noted that the oxide barrier layer 130 can protect the conductive components in the bit line structure 120, i.e., the conductive silicon layer 122 and the conductive layer 124, from being affected by nitrogen diffusion when forming the first nitride layer 140 and the second nitride layer 160. Therefore, the semiconductor structure 100 can have excellent electrical performance.

Next, please refer to FIGS. 2-5. FIGS. 2-5 are cross-sectional views of semiconductor structures, in accordance with some embodiments of the present disclosure.

Figure 2:
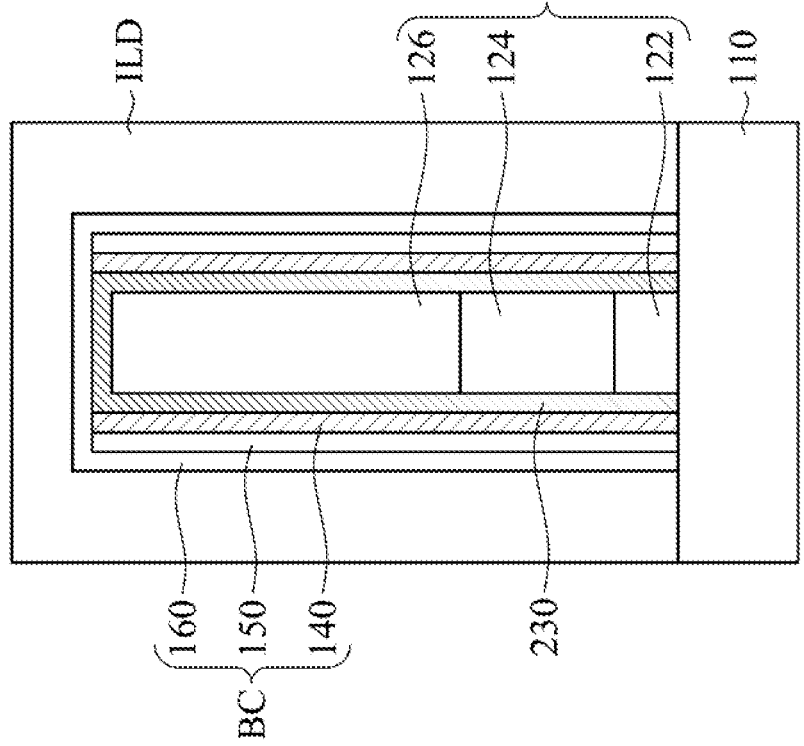

Attention is now invited to FIG. 2. A semiconductor structure 200 includes a substrate 110, a bit line structure 120, an oxide barrier layer 230, a bit line capping layer BC, and an interlayer dielectric layer ILD. In some embodiments, the oxide barrier layer 230 is formed by an atomic layer deposition (ALD) or a chemical vapor deposition (CVD). In some embodiments, the oxide barrier layer 130 has a thickness between 3 angstrom and 5 angstrom. In some embodiments, the entire oxide barrier layer 230 comprises the same material, such as insulating oxide. For example, the oxide barrier layer 130 consists of $SiO_2$. The difference between the semiconductor structure 200 and the semiconductor structure 100 is that the oxide barrier layer 130 comprises three portions with different materials; however, the oxide barrier layer 230 comprises the same material.

It is noted that the oxide barrier layer 230 can protect the conductive components in the bit line structure 120, i.e., the conductive silicon layer 122 and the conductive layer 124, from being affected by nitrogen diffusion when forming the first nitride layer 140 and the second nitride layer 160. Therefore, the semiconductor structure 200 can have excellent electrical performance.

Figure 3:
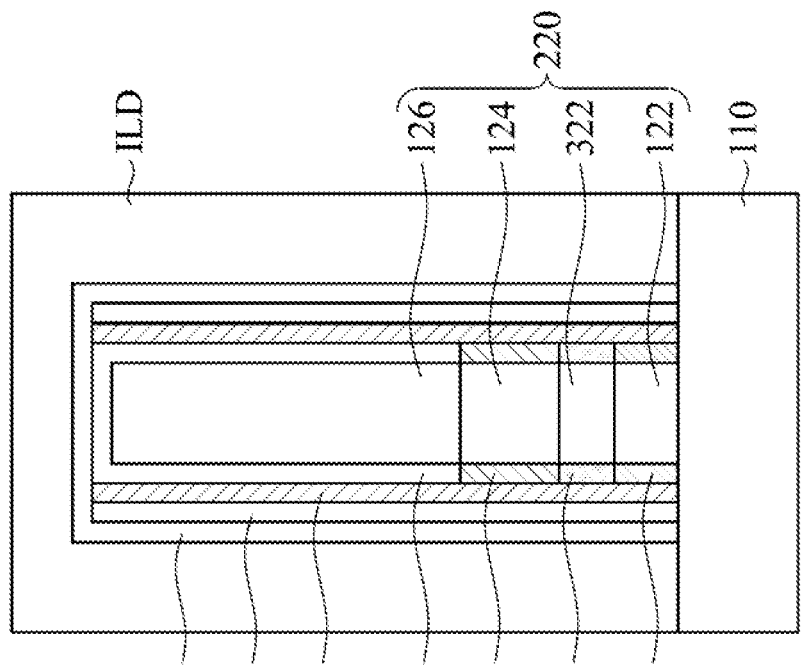
FIGS. 2-5 are cross-sectional views of semiconductor structures, in accordance with some embodiments of the present disclosure.

Attention is now invited to FIG. 3. A semiconductor structure 300 includes a substrate 110, a bit line structure 220, an oxide barrier layer 330, a bit line capping layer BC, and an interlayer dielectric layer ILD. The bit line structure 220 includes a conductive silicon layer 122, a first barrier layer 322, a conductive layer 124, and a hard mask layer 126. The difference between the semiconductor structure 300 and the semiconductor structure 100 is that the semiconductor structure 300 further includes the first barrier layer 322, and the oxide barrier layer 330 further includes a fourth portion 332. The first barrier layer 322 is disposed between the conductive silicon layer 122 and the conductive layer 124, in which the first barrier layer 322 includes a second metal. In some embodiments, the oxide barrier layer 130 is formed by performing a plasma treatment on the bit line structure 220 to form the oxide barrier layer 130 by oxidizing a first surface portion of the conductive silicon layer 122, a second surface portion of the conductive layer 124, a third surface portion of the hard mask layer 126, and a fourth surface portion of the first barrier layer 322. Therefore, the oxide barrier layer 130 includes a first portion 132 in direct contact with the conductive silicon layer 122, a second portion 134 in direct contact with the conductive layer 124, a third portion 136 in direct contact with the hard mask layer 126, and a fourth portion 332 in direct contact with the first barrier layer 322. The fourth portion 332 includes a second oxide of the second metal. In some other embodiments, the oxide barrier layer 330 is replaced with the oxide barrier layer 230 shown in FIG. 2.

Please still refer to FIG. 3. In some embodiments, the first barrier layer 322 includes a metal layer, a metal nitride layer, a metal silicide layer, or combinations thereof. In other words, the first barrier layer 322 includes a metal barrier layer, a metal nitride barrier layer, a metal silicide barrier layer, or combinations thereof. In some embodiments, the first barrier layer 322 includes two layers selected from the group consisting of the metal barrier layer, the metal nitride barrier layer, and the metal silicide barrier layer. In some embodiments, the first barrier layer 322 includes the metal barrier layer, the metal nitride barrier layer, and the metal silicide barrier layer.

In some embodiments, the metal layer includes a metal selected from the group consisting of Co, Cu, Ni, Ru, Mn, Ag, Au, Pt, Fe, Mo, Rh, Ti, Ta, and W, the metal nitride layer includes a material selected from the group consisting of tungsten nitride, TiN, and TaN, and the metal silicide layer includes a material selected from the group consisting of tungsten silicide, tantalum silicide, titanium silicide, molybdenum silicide, zirconium silicide, cobalt silicide, chromium silicide, and nickel silicide. The tungsten nitride includes $W_2N$, WN, $WN_2$, or combinations thereof. The tungsten silicide includes $WSi_2$, WSi, or a combination thereof.

Please still refer to FIG. 3. In some embodiments, the conductive silicon layer 122 includes polysilicon, the first barrier layer 322 includes Ti, TiN, tungsten nitride, or tungsten silicide, the conductive layer 124 includes W, and the hard mask layer 126 includes $Si_3N_4$. The oxide barrier layer 330 is formed by oxidizing surface portions of the conductive silicon layer 122, the first barrier layer 322, the conductive layer 124, and the hard mask layer 126. The oxide barrier layer 130 includes the first portion 132 containing SiO, $SiO_2$, or a combination thereof, the second portion 134 containing $WO_3$, the third portion 136 containing SiON, and the fourth portion 332 containing $TiO_2$ or $WO_3$.

Figure 4:
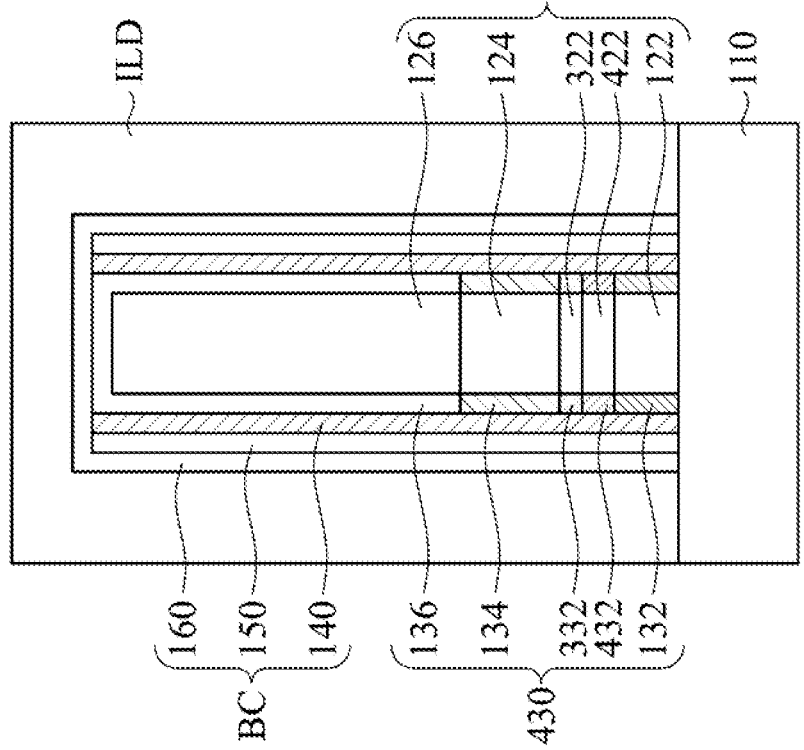

Please refer to FIG. 4. A semiconductor structure 400 includes a substrate 110, a bit line structure 420, an oxide barrier layer 430, a bit line capping layer BC, and an interlayer dielectric layer ILD. The bit line structure 420 includes a conductive silicon layer 122, a first barrier layer 322, a second barrier layer 422, a conductive layer 124, and a hard mask layer 126. The difference between the semiconductor structure 400 and the semiconductor structure 300 is that the semiconductor structure 400 further includes a second barrier layer 422, and the oxide barrier layer 430 further includes a fifth portion 432. The second barrier layer 422 is disposed between the conductive silicon layer 122 and the first barrier layer 322, in which the second barrier layer 422 includes a third metal. In some embodiments, the oxide barrier layer 430 is formed by performing a plasma treatment on the bit line structure 420 to form the oxide barrier layer 430 by oxidizing a first surface portion of the conductive silicon layer 122, a second surface portion of the conductive layer 124, a third surface portion of the hard mask layer 126, a fourth surface portion of the first barrier layer 322, and a fifth surface portion of the second barrier layer 422. Therefore, the oxide barrier layer 430 includes a first portion 132 in direct contact with the conductive silicon layer 122, a second portion 134 in direct contact with the conductive layer 124, a third portion 136 in direct contact with the hard mask layer 126, a fourth portion 332 in direct contact with the first barrier layer 322, and a fifth portion 432 in direct contact with the second barrier layer 422. The fifth portion 432 includes a third oxide of the third metal. In some other embodiments, the oxide barrier layer 430 is replaced with the oxide barrier layer 230 shown in FIG. 2.

Please still refer to FIG. 4. In some embodiments, the first barrier layer 322 is a first metal nitride layer or a metal silicide layer, the second barrier layer 422 is a second metal nitride layer or a metal layer, and the first metal nitride layer and the second metal nitride layer have different materials. In some embodiments, the first metal nitride layer and the second metal nitride layer independently include a material selected from the group consisting of tungsten nitride, TiN, and TaN. In some embodiments, the metal silicide layer includes a material selected from the group consisting of tungsten silicide, tantalum silicide, titanium silicide, molybdenum silicide, zirconium silicide, cobalt silicide, chromium silicide, and nickel silicide. In some embodiments, the metal layer includes a metal selected from the group consisting of Co, Cu, Ni, Ru, Mn, Ag, Au, Pt, Fe, Mo, Rh, Ti, Ta, and W.

Please still refer to FIG. 4. In some embodiments, the conductive silicon layer 122 includes polysilicon, the first barrier layer 322 includes tungsten nitride or tungsten silicide, the second barrier layer 422 includes Ti or TiN, the conductive layer 124 includes W, and the hard mask layer 126 includes $Si_3N_4$. The oxide barrier layer 430 is formed by oxidizing surface portions of the conductive silicon layer 122, the first barrier layer 322, the second barrier layer 422, the conductive layer 124, and the hard mask layer 126. The oxide barrier layer 430 includes the first portion 132 containing SiO, $SiO_2$, or a combination thereof, the second portion 134 containing $WO_3$, the third portion 136 containing SiON, and the fourth portion 332 containing $WO_3$, and the fifth portion 432 containing $TiO_2$.

Figure 5:
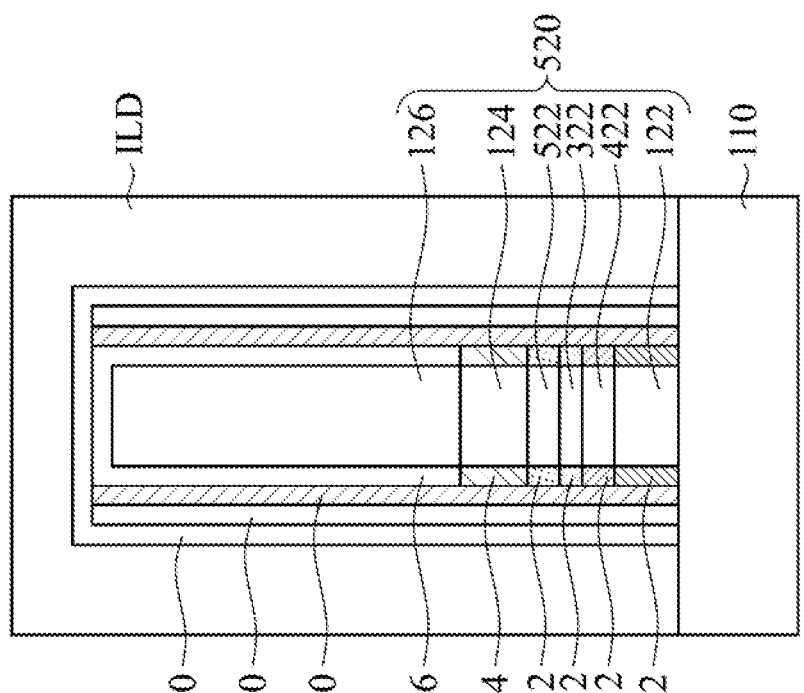

As shown in FIG. 5, a semiconductor structure 500 includes a substrate 110, a bit line structure 520, an oxide barrier layer 530, a bit line capping layer BC, and an interlayer dielectric layer ILD. The bit line structure 520 includes a conductive silicon layer 122, a first barrier layer 322, a second barrier layer 422, a third barrier layer 522, a conductive layer 124, and a hard mask layer 126. The difference between the semiconductor structure 500 and the semiconductor structure 400 is that the semiconductor structure 500 further includes a third barrier layer 522, and the oxide barrier layer 530 further includes a sixth portion 532. The third barrier layer 522 is disposed between the first barrier layer 322 and the conductive layer 124, in which the third barrier layer 522 includes a fourth metal. In some embodiments, the oxide barrier layer 530 is formed by performing a plasma treatment on the bit line structure 520 to form the oxide barrier layer 530 by oxidizing a first surface portion of the conductive silicon layer 122, a second surface portion of the conductive layer 124, a third surface portion of the hard mask layer 126, a fourth surface portion of the first barrier layer 322, a fifth surface portion of the second barrier layer 422, and a sixth surface portion of the third barrier layer 522. Therefore, the oxide barrier layer 530 includes a first portion 132 in direct contact with the conductive silicon layer 122, a second portion 134 in direct contact with the conductive layer 124, a third portion 136 in direct contact with the hard mask layer 126, a fourth portion 332 in direct contact with the first barrier layer 322, a fifth portion 432 in direct contact with the second barrier layer 422, and a sixth portion 532 in direct contact with the third barrier layer 522. The sixth portion 532 includes a fourth oxide of the fourth metal. In some other embodiments, the oxide barrier layer 530 is replaced with the oxide barrier layer 230 shown in FIG. 2.

Please still refer to FIG. 5. In some embodiments, the first barrier layer 322 is a metal silicide layer, the second barrier layer 422 is a metal layer or a first metal nitride layer, the third barrier layer 522 is a second metal nitride layer, and the first metal nitride layer and the second metal nitride layer have different materials. In some embodiments, the first metal nitride layer and the second metal nitride layer independently include a material selected from the group consisting of tungsten nitride, TiN, and TaN. In some embodiments, the metal silicide layer includes a material selected from the group consisting of tungsten silicide, tantalum silicide, titanium silicide, molybdenum silicide, zirconium silicide, cobalt silicide, chromium silicide, and nickel silicide. In some embodiments, the metal layer includes a metal selected from the group consisting of Co, Cu, Ni, Ru, Mn, Ag, Au, Pt, Fe, Mo, Rh, Ti, Ta, and W.

Please still refer to FIG. 5. In some embodiments, the conductive silicon layer 122 includes polysilicon, the first barrier layer 322 includes tungsten silicide, the second barrier layer 422 includes Ti or TiN, the third barrier layer 522 includes tungsten nitride, the conductive layer 124 includes W, and the hard mask layer 126 includes $Si_3N_4$. The oxide barrier layer 530 is formed by oxidizing surface portions of the conductive silicon layer 122, the first, second, and third barrier layers, 322, 422, 522, the conductive layer 124, and the hard mask layer 126. The oxide barrier layer 530 includes the first portion 132 containing SiO, $SiO_2$, or a combination thereof, the second portion 134 containing $WO_3$, the third portion 136 containing SiON, and the fourth portion 332 containing $WO_3$, the fifth portion 432 containing $TiO_2$, and the sixth portion 532 containing $WO_3$.

The experiment conditions (temperature, plasma gas, flow rate percentage, treatment time, treatment time, plasma power) of forming the oxide barrier layers, 330, 430, 530, and the thicknesses of the oxide barrier layers, 330, 430, 530, can refer to the embodiments of the oxide barrier layer 130, and the descriptions thereof will not be repeated.

It is noted that the oxide barrier layers, 330, 430, 530, can protect the conductive components in the bit line structures, i.e., the conductive silicon layer 122, the conductive layer 124, and barrier layers, from being affected by nitrogen diffusion when forming the first nitride layer 140 and the second nitride layer 160. Therefore, the semiconductor structures, 300, 400, 500, can have excellent electrical performance.

In conclusion, the present disclosure provides a semiconductor structure and a manufacturing method thereof. The semiconductor structure includes a bit line structure covered by an oxide barrier layer that can block element diffusion into the bit line structure during forming a bit line capping layer on the oxide barrier layer. Therefore, the semiconductor structure can have excellent electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
 a substrate;
 a bit line structure disposed on the substrate, wherein the bit line structure comprises:
 a conductive silicon layer;
 a conductive layer disposed on the conductive silicon layer, wherein the conductive layer comprises a first metal; and
 a hard mask layer disposed on the conductive layer,
 an oxide barrier layer disposed in direct contact with a first sidewall of the bit line structure and a top surface of the hard mask layer, wherein the oxide barrier layer comprises a first portion in direct contact with the conductive silicon layer, a second portion in direct contact with the conductive layer, and a third portion in direct contact with the hard mask layer, the first portion comprises SiO, $SiO_2$, or a combination thereof, the second portion comprises a first oxide of the first metal, the third portion comprises a second oxide of an insulating material of the hard mask layer, the insulating material of the hard mask layer is selected from the group consisting of $Si_3N_4$, SiCN, and SiC, and the first portion, the second portion, and the third portion of the oxide barrier layer are different materials; and
a bit line capping layer covering the oxide barrier layer.

2. The semiconductor structure of claim 1, further comprising:
a first barrier layer disposed between the conductive silicon layer and the conductive layer, wherein the first barrier layer comprises a second metal, the oxide barrier layer further comprises a fourth portion in direct contact with the first barrier layer, and the fourth portion comprises a third oxide of the second metal.

3. The semiconductor structure of claim 2, wherein the first barrier layer comprises a metal layer, a metal nitride layer, a metal silicide layer, or combinations thereof.

4. The semiconductor structure of claim 3, wherein the metal layer comprises a metal selected from the group consisting of Co, Cu, Ni, Ru, Mn, Ag, Au, Pt, Fe, Mo, Rh, Ti, Ta, and W, the metal nitride layer comprises a material selected from the group consisting of tungsten nitride, TiN, and TaN, and the metal silicide layer comprises a material selected from the group consisting of tungsten silicide, tantalum silicide, titanium silicide, molybdenum silicide, zirconium silicide, cobalt silicide, chromium silicide, and nickel silicide.

5. The semiconductor structure of claim 2, further comprising:
a second barrier layer disposed between the conductive silicon layer and the first barrier layer, wherein the second barrier layer comprises a third metal, the oxide barrier layer further comprises a fifth portion in direct contact with the second barrier layer, and the fifth portion comprises a fourth oxide of the third metal.

6. The semiconductor structure of claim 5, wherein the first barrier layer is a first metal nitride layer or a metal silicide layer, the second barrier layer is a second metal nitride layer or a metal layer, and the first metal nitride layer and the second metal nitride layer have different materials.

7. The semiconductor structure of claim 5, further comprising a third barrier layer disposed between the first barrier layer and the conductive layer, wherein the third barrier layer comprises a fourth metal, the oxide barrier layer further comprises a sixth portion in direct contact with the third barrier layer, and the sixth portion comprises a fifth oxide of the fourth metal.

8. The semiconductor structure of claim 7, wherein the first barrier layer is a metal silicide layer, the second barrier layer is a metal layer or a first metal nitride layer, the third barrier layer is a second metal nitride layer, and the first metal nitride layer and the second metal nitride layer have different materials.

9. The semiconductor structure of claim 1, wherein the bit line capping layer comprises:
a first nitride layer covering a second sidewall of the oxide barrier layer;
an oxide layer covering a third sidewall of the first nitride layer; and
a second nitride layer covering a fourth sidewall of the oxide layer and a top surface of the bit line structure.

10. The semiconductor structure of claim 1, wherein the conductive layer comprises a metal selected from the group consisting of W, Ru, Ir, Pt, Rh, and Mo.

11. The semiconductor structure of claim 1, wherein the bit line capping layer comprises a first nitride layer, an oxide layer, and a second nitride layer covering the oxide barrier layer in sequence, and the first nitride layer and the oxide layer have flush top surfaces.

12. The semiconductor structure of claim 1, wherein the bit line capping layer comprises a first nitride layer, an oxide layer, and a second nitride layer covering the oxide barrier layer in sequence, and the second nitride layer is in contact with a top portion of the oxide barrier layer.

13. A method of manufacturing a semiconductor structure, comprising:
receiving a bit line structure disposed on a substrate, wherein the bit line structure comprises:
a conductive silicon layer;
a conductive layer disposed on the conductive silicon layer, wherein the conductive layer comprises a first metal; and
a hard mask layer disposed on the conductive layer, wherein the hard mask layer comprises an insulating material selected from the group consisting of $Si_3N_4$, SiCN, and SiC;
performing a plasma treatment on the bit line structure to form an oxide barrier layer in direct contact with a sidewall of the bit line structure and a top surface of the hard mask layer by oxidizing a first surface portion of the conductive silicon layer, a second surface portion of the conductive layer, and a third surface portion of the hard mask layer; and
forming a bit line capping layer covering the oxide barrier layer.

14. The method of claim 13, wherein the plasma treatment is performed at a temperature between 225° C. and 275° C., and a plasma gas is generated from an oxidizing gas and a reducing gas.

15. The method of claim 14, wherein a flow rate percentage of the reducing gas is between 30% and 50% in the plasma gas.

16. The method of claim 13, wherein a treatment time of the plasma treatment is between 20 seconds and 45 seconds.

17. The method of claim 13, wherein the bit line structure further comprises:
a first barrier layer disposed between the conductive silicon layer and the conductive layer, wherein the first barrier layer comprises a second metal.

18. The method of claim 17, wherein performing the plasma treatment on the bit line structure further comprises:
oxidizing a fourth surface portion of the first barrier layer.

19. The method of claim 13, wherein a plasma gas is generated from an oxidizing gas and a reducing gas, and the reducing gas comprises $NH_3$.

* * * * *